(12) United States Patent
Bellaouar et al.

(10) Patent No.: US 9,774,302 B1
(45) Date of Patent: Sep. 26, 2017

(54) AMPLIFIER CIRCUIT WITH SINGLE-ENDED INPUT AND DIFFERENTIAL OUTPUTS

(71) Applicant: GLOBALFOUNDRIES INC., Grand Cayman (KY)

(72) Inventors: Abdellatif Bellaouar, Richardson, TX (US); Sher Jiun Fang, Allen, TX (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/277,344

(22) Filed: Sep. 27, 2016

(51) Int. Cl.
*H03F 1/34* (2006.01)
*H03F 3/195* (2006.01)

(52) U.S. Cl.
CPC .............. *H03F 1/342* (2013.01); *H03F 3/195* (2013.01); *H03F 2200/294* (2013.01); *H03F 2200/451* (2013.01); *H03F 2200/555* (2013.01); *H03F 2200/72* (2013.01); *H03F 2200/75* (2013.01)

(58) Field of Classification Search
CPC ........................................................ H03F 1/34
USPC ................................. 330/293, 301, 117, 311
See application file for complete search history.

(56) References Cited

U.S. PATENT DOCUMENTS

| | | | |
|---|---|---|---|
| 6,366,171 B1 | 4/2002 | Litmanen et al. | |
| 7,224,231 B2 | 5/2007 | Wu | |
| 7,468,634 B2 * | 12/2008 | Yen | H03F 1/233 330/278 |
| 7,760,028 B2 | 7/2010 | Sanduleanu et al. | |
| 8,310,309 B2 | 11/2012 | Behera et al. | |
| 8,725,105 B2 | 5/2014 | Tsai et al. | |
| 2006/0044069 A1 * | 3/2006 | King | H03F 3/45179 330/301 |
| 2013/0135029 A1 * | 5/2013 | Xu | H03F 3/193 327/355 |
| 2013/0316668 A1 | 11/2013 | Davierwalla et al. | |
| 2014/0070899 A1 | 3/2014 | Liu et al. | |

(Continued)

OTHER PUBLICATIONS

Miguel A. Martins, "A Single-to-Differential LNA Topology with Robust Output Gain-Phase Balancing against Balun Imbalance", IEEE 2011, pp. 289-292.

(Continued)

*Primary Examiner* — Henry Choe
(74) *Attorney, Agent, or Firm* — Gibb & Riley, LLC; David A. Cain, Esq.

(57) ABSTRACT

Disclosed is an amplifier circuit having a single-ended input and differential outputs. The differential outputs are achieved using a first output branch and a second output branch, each including a common source FET (CS-FET) and a common gate FET (CG-FET) connected in series between ground and a corresponding out node connected to a load. An input signal is applied to the CS-FET in the first output branch and an intermediate signal at an intermediate node between the CS-FET and the CG-FET in the first output branch is applied to the CS-FET in the second output branch. The CG-FET in the first output branch and the CS-FET in the second output branch are equal in size such that their transconductances are approximately equal, such that currents in the two output branches are inverted and the outputs at the output nodes of the two output branches are differential outputs.

20 Claims, 3 Drawing Sheets

(56) References Cited

U.S. PATENT DOCUMENTS

2014/0225675 A1   8/2014   Kaukovuori et al.
2014/0266469 A1   9/2014   Issakov

OTHER PUBLICATIONS

Stephan C. Blaakmeer et al., "A wideband Noise-Canceling CMOS LNA exploiting a transformer", University of Twente, IC-Design Group, The Netherlands Philips Research Laboratories, The Netherlands, Jun. 2008, pp. 1-4.
F. Bruccoleri et al, "Wide-Band CMOS Low-Noise Amplifier Exploiting Thermal Noise Canceling," IEEE JSSC, Feb. 2004, pp. 275-282.

* cited by examiner

AMPLIFIER CIRCUIT WITH SINGLE-ENDED INPUT AND DIFFERENTIAL OUTPUTS

FIELD OF THE INVENTION

The present invention relates to amplifiers and, more specifically, to an amplifier circuit with a single-ended input and a differential output.

BACKGROUND

In complex radio frequency (RF) devices, such as RF transceivers, the number of low noise amplifiers (LNA) having a single-ended input and differential outputs has become relatively large (e.g., 30 or more). Typically, the differential outputs are achieved by incorporating a transformer into the LNA structure. Unfortunately, transformers consume a significant amount of chip area and compensation circuitry to balance the phase and amplitude of the resulting differential outputs is often required if active components are used. Additionally, when RF devices are integrated into a system-on-chip (SOC), undesirable digital coupling can occur between the system components and the transformers.

SUMMARY

In view of the foregoing, disclosed herein are embodiments of an amplifier circuit (e.g., a low-noise amplifier (LNA) circuit) having a single-ended input and differential outputs. The differential outputs can be achieved through the use of two output branches (i.e., a first output branch and a second output branch). Each output branch can include a common source field effect transistor (CS-FET) and a common gate field effect transistor (CG-FET) connected in series between ground and a corresponding output node connected to a load. An input signal at an input node can be applied to the CS-FET in the first output branch and an intermediate signal at an intermediate node between the CS-FET and the CG-FET in the first output branch can be applied to the CS-FET in the second output branch. The CG-FET in the first output branch can be approximately equal in size to the CS-FET in the second output branch such that the transconductances (Gm) of these FETs are approximately equal and, thereby such that currents in the first output branch and the second output branch are inverted and the outputs at the output nodes of the two output branches are differential outputs.

An amplifier circuit disclosed herein can include an amplifier connected at one end to an input node and connected at an opposite end to a pair of output branches (i.e., a first output branch and a second output branch). The first output branch can include a first output node and a first transistor and a second transistor electrically connected in series to the first output node. Similarly, the second output branch can include a second output node and a third transistor and a fourth transistor electrically connected in series to the second output node. The first transistor can have a first gate electrically connected to an input node. The second transistor can have a second gate electrically connected to a voltage reference. The third transistor can have a third gate electrically connected to an intermediate node between the first transistor and the second transistor of the first output branch. The fourth transistor can have a fourth gate electrically connected to the voltage reference. The circuit can further include a fifth transistor that electrically couples the pair of output branches to the amplifier. This fifth transistor can be electrically connected between the intermediate node and a supply voltage and can have a fifth gate coupled to the input node through the amplifier.

Another amplifier circuit disclosed herein can include an amplifier, which employs resistive feedback, connected at one end to an input node and at an opposite end to a pair of output branches. The amplifier can include a resistive feedback inverter. The pair of output branches can include a first output branch and a second output branch. The first output branch can include a first output node and a first transistor and a second transistor electrically connected in series to the first output node. Similarly, the second output branch can include a second output node and a third transistor and a fourth transistor electrically connected in series to the second output node. The first transistor can have a first gate electrically connected to an input node. The second transistor can have a second gate electrically connected to a voltage reference. The third transistor can have a third gate electrically connected to an intermediate node between the first transistor and the second transistor of the first output branch. The fourth transistor can have a fourth gate electrically connected to the voltage reference. This circuit can further include a fifth transistor that electrically couples the pair of output branches to the amplifier. The fifth transistor can be electrically connected between the intermediate node and a supply voltage and can have a fifth gate coupled to the input node through the amplifier.

Yet another amplifier circuit disclosed herein can include an amplifier, which employs resistive feedback, connected at one end to an input node and at an opposite end to a pair of output branches having output nodes electrically connected to a load, which employs common-mode feedback. The amplifier can include a resistive feedback inverter. The pair of output branches can include a first output branch and a second output branch. The first output branch can include a first output node and at least a first transistor and a second transistor electrically connected between ground and the first output node. Similarly, the second output branch can include a second output node and at least a third transistor and a fourth transistor electrically connected in series between ground and the second output node. The first transistor can have a first gate electrically connected to an input node. The second transistor can have a second gate electrically connected to a voltage reference. The third transistor can have a third gate electrically connected to an intermediate node between the first transistor and the second transistor of the first output branch. The fourth transistor can have a fourth gate electrically connected to the voltage reference. This circuit can further include a load. The load can be electrically connected to both the first output node and the second output node and, more specifically, can include load current sources electrically connected to the first output node and the second output node by a first connecting wire and a second connecting wire, respectively. The load can further include a common-mode feedback circuit having inputs electrically connected to the first connecting wire and the second connecting wire and an output electrically connected to the current sources. This circuit can further include a fifth transistor that electrically couples the pair of output branches to the amplifier. The fifth transistor can be electrically connected between the intermediate node and a positive supply voltage and can have a fifth gate coupled to the input node through the amplifier. The first transistor, the second transistor, the third transistor, the fourth transistor and the fifth transistor of this amplifier circuit can all be n-type field effect transistors.

In each of the embodiments of the amplifier circuit described above, the second transistor can be approximately equal in size to the third transistor such that the transconductances (Gm) of these FETs are approximately equal and, thereby such that currents in the first output branch and the second output branch are inverted and the outputs at the first output node and the second output node are differential outputs.

BRIEF DESCRIPTION OF THE SEVERAL VIEWS OF THE DRAWINGS

The present invention will be better understood from the following detailed description with reference to the drawings, which are not necessarily drawn to scale and in which.

DETAILED DESCRIPTION

As mentioned above, in complex radio frequency (RF) devices, such as RF transceivers, the number of low noise amplifiers (LNA) having a single-ended input and differential outputs has become relatively large (e.g., 30 or more). Typically, the differential outputs are achieved by incorporating a transformer into the LNA structure. Unfortunately, transformers consume a significant amount of chip area and compensation circuitry to balance the phase and amplitude of the resulting differential outputs is often required if active components are used. Additionally, when RF devices are integrated into a system-on-chip (SOC), undesirable digital coupling can occur with between the system components and the transformers.

In view of the foregoing, disclosed herein are embodiments of an amplifier circuit (e.g., a low-noise amplifier circuit) having a single-ended input and differential outputs. The differential outputs can be achieved through the use of two output branches (i.e., a first output branch and a second output branch). Each output branch can include a common source field effect transistor (CS-FET) and a common gate field effect transistor (CG-FET) connected in series between ground and a corresponding output node connected to a load. An input signal at an input node can be applied to the CS-FET in the first output branch and an intermediate signal at an intermediate node between the CS-FET and the CG-FET in the first output branch can be applied to the CS-FET in the second output branch. The CG-FET in the first output branch can be approximately equal in size to the CS-FET in the second output branch such that the transconductances (Gm) of these FETs are approximately equal and, thereby such that currents in the first output branch and the second output branch are inverted and the outputs at the output nodes of the two output branches are differential outputs.

Figure 1:
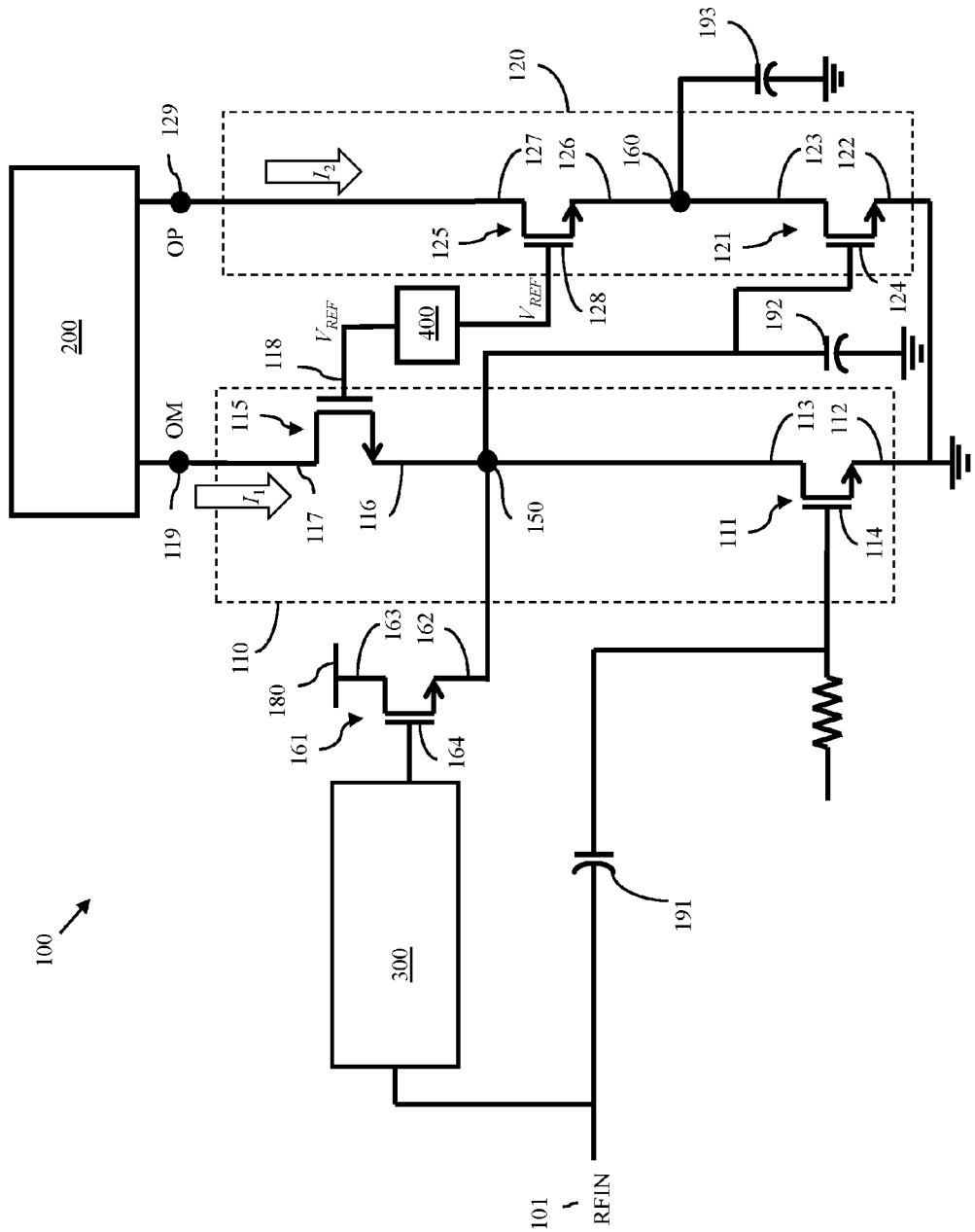
FIG. 1 is a schematic diagram illustrating an amplifier circuit having a single-ended input and differential outputs.

More particularly, referring to FIG. 1, disclosed are embodiments of an amplifier circuit 100 (e.g., a low-noise amplifier circuit) having a single-ended input and differential outputs.

The amplifier circuit 100 can include an amplifier 300 connected at one end to an input node and at an opposite end to a pair of output branches connected to a load 200.

The pair of output branches can include a first output branch 110 and a second output branch 120, each with multiple field effect transistors (FETs) and, particularly, multiple N-type field effect transistors (NFETs) connected in series between the load and ground. The FETs in the output branches can be essentially symmetrical. Additionally, the FETs in the output branches can have any suitable FET configuration including, but not limited to, a planar FET configuration or a non-planar FET configuration (e.g., a fin-type field effect transistor (finFET) configuration or trigate FET configuration).

In any case, the first output branch 110 can include a first output node 119 connected to the load 200 and outputting a first output signal (OM). The first output branch 110 can further include at least a first transistor 111 and a second transistor 115 electrically connected in series between ground and the first output node 119. The first transistor 111 can be a common source field effect transistor (CS-FET) and the second transistor 115 can be a common gate field effect transistor (CG-FET). Those skilled in the art will recognize that a CS-FET is a FET, wherein the input is to the gate and the output is at the drain, whereas a common gate field effect transistor is a FET, wherein the input is to the source and the output is at the drain.

Similarly, the second output branch 120 can include a second output node 129 connected to the load 200 and outputting a second output signal (OP). The second output branch 120 can further include at least a third transistor 121 and a fourth transistor 125 electrically connected in series between ground and the second output node 129. The third transistor 121 can be a CS-FET and the fourth transistor 125 can be a CG-FET.

In the first output branch 110, the first transistor (i.e., the CS-FET of the first output branch) can have a first gate 114 electrically coupled to an input node 101 (e.g., via a first AC coupling capacitor 191) and, thus, controlled by an input signal (e.g., a radio frequency (RF) input signal) received at the input node 101. The first transistor 111 can further have a first source 112 directly connected to ground and a first drain 113 directly connected to an intermediate node 150. The second transistor 115 (i.e., the CG-FET of the first output branch) can have a second gate 118 electrically connected to a voltage reference 400, which applies a predetermined reference voltage thereto. The second transistor 115 can further have a second source 116 directly connected to the intermediate node 150 and a second drain 117 connected to the first output node 119 and, thereby to the load 200. Thus, the intermediate node 150 is specifically a node between and electrically connecting the first transistor 111 to the second transistor 115 within the first output branch 110.

In the second output branch 120, the third transistor 121 (i.e., the CS-FET of the first output branch) can have a third gate 124, which is electrically connected to the intermediate node 150 and, thus, controlled by a signal on the intermediate node 150. It should be noted that the intermediate node 150 and the third gate 124 can also be electrically coupled to ground via a parasitic capacitor 192. The third transistor 121 can further have a third source 122 directly connected to ground and a third drain 123 directly connected to a second intermediate node 160. The fourth transistor 125 (i.e., the CG-FET of the second output node) can have a fourth gate 128 electrically connected to the voltage reference 400, which applies the predetermined reference voltage thereto. The fourth transistor 125 can further have a fourth source 126 directly connected to the second intermediate node 160 and a fourth drain 127 directly connected to the second output node 129 and, thereby to the load 200. Thus, the second intermediate node 160 is specifically a node between and electrically connecting the third transistor 121 to the fourth transistor 125 within the second output branch 120. It should be noted that the second intermediate node 160 can also be electrically coupled to ground via another parasitic capacitor 193. The poles associated with the two parasitic capacitors 192 and 193 should be much larger than the operating frequency.

Figure 2B:
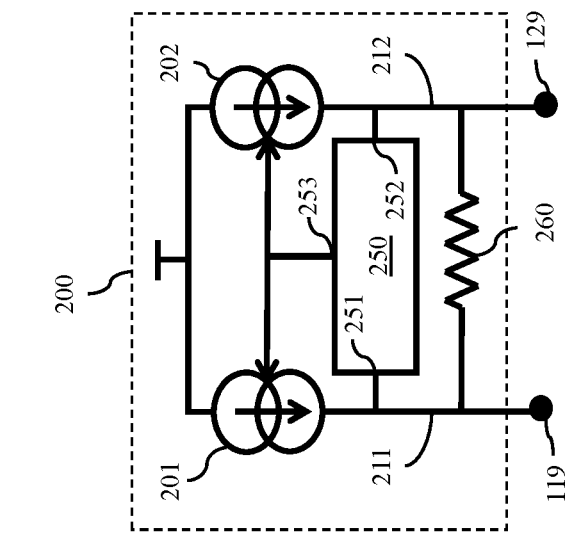
FIGS. 2A and 2B are schematic diagrams illustrating exemplary load devices that can be incorporated into the amplifier circuit of FIG. 1.
Figure 2A:
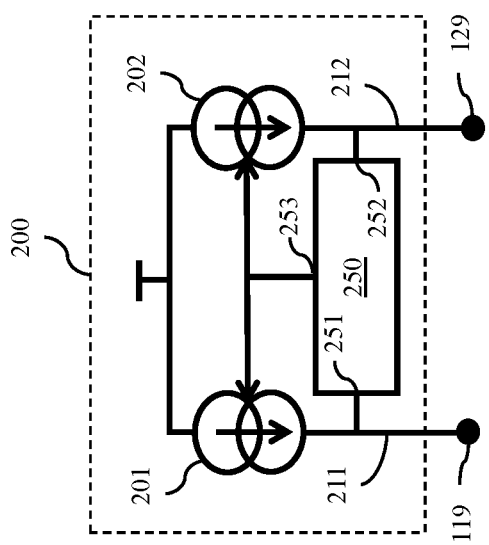

As mentioned above, the first output node 119 and the second output node 129 can each be electrically connected to the load 200. That load 200 can be any suitable load device. For example, FIGS. 2A and 2B are schematic diagrams illustrating exemplary load devices 200 that can be incorporated into the amplifier circuit 100. Such a load 200 can include load current sources 201-202 electrically connected to the output nodes. That is, the load 200 can include a first load current source 201 electrically connected to a positive supply voltage and further electrically connected, by a first connecting wire 211, to the first output node. The load 200 can also include a second current source 202 electrically connected to the positive supply voltage and further electrically connected, by a second connecting wire 212, to the second output node. These current sources 201-202 can each be, for example, a single p-type field effect transistor (PFET) or, alternatively, can each incorporate multiple PFETs in a cascode configuration. In any case, this load 200 can have a common-mode feedback circuit 250 with a first input 251 and a second input 252 electrically connected to the first connecting wire 211 and the second connecting wire 212, respectively, and with an output 253 electrically connected to both of the current sources 201-202. The common-mode feedback circuit 250 can provide a high-impedance load to differential output currents ($I_1$ and $I_2$) on the first output branch 110 and second output branch 120, respectively. Those skilled in the art will recognize that such a common-mode feedback circuit 250 is used to set the output DC voltage. Optionally, as illustrated in FIG. 2B, the load 200 can further include a resistor 260 extending between and electrically connecting the first connecting wire 211 and the second connecting wire 212 near the output nodes.

Referring again to FIG. 1, the amplifier circuit 100 can further include a fifth transistor 161, which is also an NFET and which electrically couples the amplifier 300 to the pair of output branches. More specifically, the fifth transistor 161 can be electrically connected between the intermediate node 150 and a positive supply voltage 180. As mentioned above, the intermediate node 150 is a node between and electrically connecting the first transistor 111 to the second transistor 115 within the first output branch 110. This fifth transistor 161 can be a source follower field effect transistor (SF-FET) (also referred to herein as a common drain field effect transistor (CD-FET)). Those skilled in the art will recognize that a SF-FET (or a CD-FET) is a FET, wherein the input is to the gate and the output is at the source. The fifth transistor 161 can have a fifth source 162, which is directly connected to the intermediate node 150, and a fifth drain 163 connected to the positive supply voltage 180. The fifth transistor 161 can further have a fifth gate 164, which is coupled to the input node 101 through the amplifier 300 such that the fifth gate 164 is indirectly controlled by an input signal (e.g., a radio frequency (RF) input signal) at the input node 101.

Figures 3A, 3B:
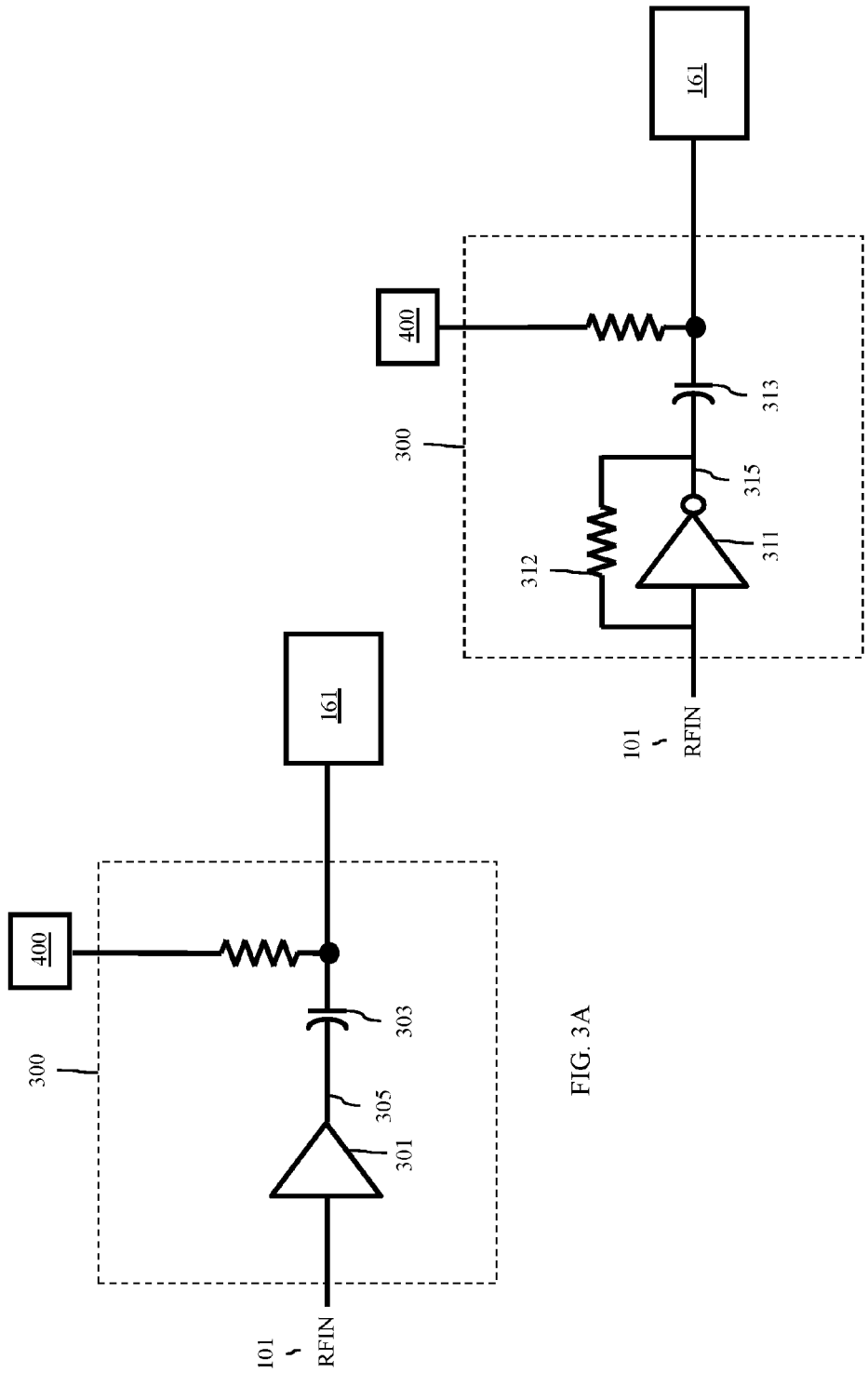
FIGS. 3A and 3B are schematic diagrams illustrating exemplary amplifiers that can be incorporated into the amplifier circuit of FIG. 1.

FIGS. 3A and 3B are schematic diagrams illustrating exemplary amplifiers 300 that can be incorporated into the amplifier circuit 100. FIG. 3A includes a simple amplifier 301 and an additional AC coupling capacitor 303 electrically connected in series between the input node 101 and the fifth gate 164 of the fifth transistor 161. The simple amplifier 301 can have an amplifier input that receives the RF input signal from the input node 101 and an amplifier output that outputs an amplified RF signal 305 to the fifth gate 164 through the AC coupling capacitor 303. FIG. 3B includes an amplifier that employs inverter feedback. Specifically, this amplifier include an inverter 311 and an additional AC coupling capacitor 313 electrically connected in series between the input node 101 and the fifth gate 164 of the fifth transistor 161. The inverter 311 can have an inverter input that receives the RF input signal from the input node 101 and an inverter output that outputs an inverted RF signal 315 to the fifth gate 164 through the AC coupling capacitor 313. Additionally, a feedback resistor 312 can electrically connect the inverter output to the inverter input. Those skilled in the art will recognize that impedance matching is provided for in the amplifier circuit 100; however, the noise of the amplifier can impact the total noise figure. With the configuration shown, this noise can be canceled by sending the RF input signal at the input node through two paths including: the first path through an amplifier 300, which as shown in FIGS. 3A and 3B includes an AC coupling capacitor, to the fifth gate 164 of the fifth transistor 161 and the second path through the AC coupling capacitor 191 to the first gate 114 of the first transistor 111. The resulting noise cancellation occurs at the node 150. It should be noted that the exemplary amplifiers 300 shown in FIGS. 3A and 3B are offered for illustration purposes and are not intended to be limiting. Any other suitable amplifier could alternatively be incorporated into the amplifier circuit 100.

In any case, in the amplifier circuit 100, the predetermined reference voltage, which is supplied by the voltage reference 400 to the second gate 118 of the second transistor 115 (i.e., to the CG-FET in the first output branch 110) and to the fourth gate 128 of the fourth transistor 125 (i.e., to the CG-FET of the second output branch 120), can be equal to the sum of the gate to source voltage ($V_{GS}$) of the third transistor 121 and the $V_{GS}$ of the fifth transistor 161 (i.e., the SF-FET). Specifically, $$V_{REF} = V_{GS\ (3rd\ transistor)} + V_{GS\ (5th\ transistor)}. \quad (1)$$

Furthermore, the second transistor 115 (i.e., the CG-FET in the first output branch 110) can be approximately equal in size to the third transistor 121 (i.e., the CS-FET in the second output branch 120) such that the transconductances (Gm) of these FETs are approximately equal. As a result, a first current ($I_1$) in the first output branch 110 and a second current ($I_2$) in the second output branch 120 will be inverted (i.e., will be differential output currents) and, thus, the outputs at the first output node 119 and the second output node 129 (i.e., OM and OP, respectively) are differential outputs. More specifically, the first current ($I_1$) in the first output branch 110 can be equal to the transconductance of the second transistor 115 ($Gm_{(2nd\ transistor)}$) multiplied by the voltage (Vc) at the intermediate node 150. The second current ($I_2$) in the second output branch 120 can be equal to the negative of the transconductance of the third transistor 121 ($Gm_{(3rd\ transistor)}$) multiplied by the voltage (Vc) at the intermediate node 150. That is, $$I_1 = Gm_{(2nd\ transistor)} * Vc;\ \text{and} \quad (2)$$

$$I_2 = -Gm_{(3rd\ transistor)} * Vc \quad (3)$$

Thus, if the transconductances of the second transistor and the third transistor are the same (i.e., if $Gm_{(2nd\ transistor)} = Gm_{(3rd\ transistor)}$), then the first current ($I_1$) and the second current ($I_2$) will be inverted and, particularly, $$I_1 = I_2. \quad (4)$$

As a result, the differential generation will be essentially perfect.

It should be understood that these conditions would apply without taking into account any bandwidth limitations. However, it should be understood that the parasitic pole at the second intermediate node 160 in the second output branch 120 should have a frequency that is much larger than the operating frequency of the circuit so the symmetry of the currents is perfect. This larger frequency can, for example, be attained using a fully-depleted semiconductor-on-insulator (FDSOI process) or finFET. Furthermore, it should be understood that, if the parasitic pole at the intermediate node 150 in the first branch 110 has a frequency higher the operating frequency of the circuit, then the full differential gain will be attained, otherwise the gain is affected by the amount of the attenuation by the pole.

The embodiments of the amplifier circuit 100 discussed above each consume a very low amount of chip area as compared to amplifiers that incorporate passive components, such as transformer(s) and a degeneration inductor). Thus, devices, such as radio frequency (RF) transceivers, can incorporate a relatively large number of these amplifiers, thereby allowing for support of more bandwidths, for more carrier aggregation and for more inputs and outputs (i.e., for more multiple inputs/multiple outputs (MIMOs)). Furthermore, by using a transformerless amplifier circuit (i.e., amplifier that does not incorporate any transformers to achieve the digital outputs), the amplifier circuit disclosed herein avoids undesirable digital coupling between other on-chip components and transformer(s). Additionally, compensation circuitry to balance the phase and/or amplitude of the differential outputs is unnecessary. Although the additional output branch 120 in the amplifier circuit 100 adds additional noise sources (e.g., additional thermal noise from the third transistor 121; additional noise of the first transistor 111 through the second output branch, noise from the load 200, etc.), the added noise is balanced out by the gain increase of up to, for example, 6 decibels (dB).

It should be understood that the terminology used herein is for the purpose of describing the disclosed devices and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "on", "in direct contact", "abutting", "directly adjacent to", etc., are intended to indicate that at least one element physically contacts another element (without other elements separating the described elements). The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Therefore, disclosed above are embodiments of an amplifier circuit (e.g., a low-noise amplifier (LNA) circuit) having a single-ended input and differential outputs. The differential outputs can be achieved through the use of two output branches (i.e., a first output branch and a second output branch). Each output branch can include a common source field effect transistor (CS-FET) and a common gate field effect transistor (CG-FET) connected in series between ground and a corresponding output node connected to a load. An input signal at an input node can be applied to the CS-FET in the first output branch and an intermediate signal at an intermediate node between the CS-FET and the CG-FET in the first output branch can be applied to the CS-FET in the second output branch. The CG-FET in the first output branch can be approximately equal in size to the CS-FET in the second output branch such that the transconductances (Gm) of these FETs are approximately equal and, thereby such that currents in the first output branch and the second output branch are inverted and the outputs at the output nodes of the two output branches are differential outputs.

What is claimed is:

1. A circuit comprising:
    an amplifier;
    a first output branch comprising: a first output node; and
        a first transistor and a second transistor electrically connected in series to the first output node; and
    a second output branch comprising: a second output node; and a third transistor and a fourth transistor electrically connected in series to the second output node; and
    a fifth transistor electrically connected between an intermediate node and a supply voltage, the intermediate node being between the first transistor and the second transistor,
    the first transistor having a first gate electrically connected to an input node, the second transistor having a second gate electrically connected to a voltage reference, the third transistor having a third gate electrically connected to the intermediate node, the fourth transistor having a fourth gate electrically connected to the voltage reference, and the fifth transistor having a fifth gate electrically coupled to the input node through the amplifier, wherein a first output at the first output node and a second output at the second output node are differential outputs.

2. The circuit of claim 1,
    the first transistor and the second transistor being electrically connected in series between ground and the first output node,
    the third transistor and the fourth transistor being electrically connected in series between ground and the second output node, the supply voltage comprising a positive supply voltage, and the first transistor, the second transistor, the third transistor, the fourth transistor and the fifth transistor comprising n-type field effect transistors.

3. The circuit of claim 1, further comprising a load electrically connected to the first output node and the second output node.

4. The circuit of claim 3, the load comprising current sources electrically connected to the first output node and the second output node by a first connecting wire and a second connecting wire, respectively, and a common-mode feedback circuit having inputs electrically connected to the first connecting wire and the second connecting wire and an output electrically connected to the current sources.

5. The circuit of claim 4, the load further comprising a resistor electrically connected between the first connecting wire and the second connecting wire.

6. The circuit of claim 1, the voltage reference supplying a predetermined reference voltage to the second gate and the fourth gate, the predetermined reference voltage being equal to a sum of a gate to source voltage of the third transistor and a gate to source voltage of the fifth transistor.

7. The circuit of claim 1, the amplifier comprising an inverter having an inverter input and an inverter output coupled to the inverter input by a resistor, the inverter input connected to the input node and the inverter output coupled to the fifth gate through a coupling capacitor.

8. The circuit of claim 1, the second transistor and the third transistor having approximately equal sizes such that transconductances of the second transistor and the third transistor are essentially equal, resulting in a first current flowing in the first output branch being essentially inverted relative to a second current flowing in the second output branch and further resulting in the first output at the first output node and the second output at the second output node being differential outputs.

9. A circuit comprising:
an amplifier comprising a resistive feedback inverter;
a first output branch comprising: a first output node; and at least a first transistor and a second transistor electrically connected in series to the first output node;
a second output branch comprising: a second output node; and at least a third transistor and a fourth transistor electrically connected in series to the second output node; and
a fifth transistor electrically connected between an intermediate node and a supply voltage, the intermediate node being between the first transistor and the second transistor; and
the first transistor having a first gate electrically connected to an input node, the second transistor having a second gate electrically connected to a reference voltage, the third transistor having a third gate electrically connected to the intermediate node, the fourth transistor having a fourth gate electrically connected to the voltage reference, and the fifth transistor having a fifth gate electrically connected to the input node through the amplifier, wherein a first output at the first output node and a second output at the second output node are differential outputs.

10. The circuit of claim 9,
the first transistor and the second transistor being electrically connected in series between ground and the first output node, the third transistor and the fourth transistor being electrically connected in series between ground and the second output node, the supply voltage comprising a positive supply voltage, and the first transistor, the second transistor, the third transistor, the fourth transistor and the fifth transistor comprising n-type field effect transistors.

11. The circuit of claim 9, further comprising a load electrically connected to the first output node and the second output node.

12. The circuit of claim 11, the load comprising current sources electrically connected to the first output node and the second output node by a first connecting wire and a second connecting wire, respectively, and a common-mode feedback circuit having inputs electrically connected to the first connecting wire and the second connecting wire and an output electrically connected to the current sources.

13. The circuit of claim 12, the load further comprising a resistor electrically connected between the first connecting wire and the second connecting wire.

14. The circuit of claim 9, the voltage reference supplying a predetermined reference voltage to the second gate and the fourth gate, the predetermined reference voltage being equal to a sum of a gate to source voltage of the third transistor and a gate to source voltage of the fifth transistor.

15. The circuit of claim 9, the second transistor and the third transistor having approximately equal sizes such that transconductances of the second transistor and the third transistor are essentially equal, resulting in a first current flowing in the first output branch being essentially inverted relative to a second current flowing in the second output branch and further resulting in the first output at the first output node and the second output at the second output node being differential outputs.

16. The circuit of claim 9, the resistive feedback inverter having an inverter input and an inverter output, the inverter input connected to the input node and the inverter output coupled to the fifth gate through a coupling capacitor and further coupled to the inverter input through a feedback resistor.

17. A circuit comprising:
an amplifier comprising a resistive feedback inverter;
a first output branch comprising: a first output node; and at least a first transistor and a second transistor electrically connected in series between ground and the first output node; and
a second output branch comprising: a second output node; and at least a third transistor and a fourth transistor electrically connected in series between ground and the second output node;
a fifth transistor electrically connected between an intermediate node and a positive supply voltage, the intermediate node being between the first transistor and the second transistor; and
a load electrically connected to the first output node and the second output node, the load comprising current sources electrically connected to the first output node and the second output node by a first connecting wire and a second connecting wire, respectively, and a common-mode feedback circuit having inputs electrically connected to the first connecting wire and the second connecting wire and an output electrically connected to the current sources, the first transistor, the second transistor, the third transistor, the fourth transistor and the fifth transistor comprising n-type field effect transistors, the first transistor having a first gate electrically connected to an input node, the second transistor having a second gate electrically connected to a reference voltage, the third transistor having a third gate electrically connected to the intermediate node, the fourth transistor having a fourth gate electrically connected to the voltage reference, and the fifth transistor having a fifth gate coupled to the input node through the amplifier, wherein a first output at the first output node and a second output at the second output node are differential outputs.

18. The circuit of claim 17, the second transistor and the third transistor having approximately equal sizes such that transconductances of the second transistor and the third transistor are essentially equal, resulting in a first current flowing in the first output branch being essentially inverted relative to a second current flowing in the second output branch and further resulting in the first output at the first output node and the second output at the second output node being differential outputs.

19. The circuit of claim 17, the voltage reference supplying a predetermined reference voltage to the second gate and the fourth gate, the predetermined reference voltage being equal to a sum of a gate to source voltage of the third transistor and a gate to source voltage of the fifth transistor.

20. The circuit of claim 17, the load further comprising a resistor electrically connected between the first connecting wire and the second connecting wire.

\* \* \* \* \*